United States Patent [19]

Ishikawa et al.

[11] Patent Number: 4,673,458
[45] Date of Patent: Jun. 16, 1987

[54] METHOD FOR PREPARING A PRINTED CIRCUIT BOARD

[75] Inventors: Katsukiyo Ishikawa, Kuze; Kanji Nishijima, Ibaraki; Mamoru Seio, Nishinomiya, all of Japan

[73] Assignee: Nippon Paint Co., Ltd., Osaka, Japan

[21] Appl. No.: 837,767

[22] Filed: Mar. 10, 1986

[30] Foreign Application Priority Data

Mar. 8, 1985 [JP] Japan .................................. 60-47262

[51] Int. Cl.$^4$ .......................... C23F 1/02; B44C 1/22; C03C 15/00; C03C 25/06
[52] U.S. Cl. .................................. 156/659.1; 29/852; 156/656; 156/666; 156/902; 156/904; 204/14.1; 427/97; 430/313; 430/318
[58] Field of Search .................. 156/656, 659.1, 666, 156/901, 902, 904; 204/14.1; 427/97; 29/852; 430/313, 318; 174/68.5

[56] References Cited

U.S. PATENT DOCUMENTS 4,327,167 4/1982 Tanabe ........................... 156/901 X
4,608,274 8/1986 Wooten .......................... 156/902 X Primary Examiner—William A. Powell
Attorney, Agent, or Firm—Wenderoth, Lind & Ponack

[57] ABSTRACT

The invention provides a method for preparing a printed circuit board with plated-through-holes, using a specifically prepared photoresist material and a combination of exposure, development and etching means. This method is particularly useful for the preparation of a printed circuit board with plated-through-holes bearing a high density circuit pattern.

3 Claims, 6 Drawing Figures

METHOD FOR PREPARING A PRINTED CIRCUIT BOARD

FIELD OF THE INVENTION

The present invention relates to a method for preparing a printed circuit board with plated-through-holes. More specifically, it concerns a method for preparing a printed circuit board with plated-through-holes bearing a high density circuit pattern by simple steps, with a high reliability and at a lower expense.

DESCRIPTION OF THE PRIOR ART

Heretofore, various methods have been proposed for the preparation of a printed circuit board with plated-through-holes, but none of the methods gave fruitful answers to the problems of producing a printed circuit board with a high density circuit pattern in a simple way, and with a high reliability.

For example, in a method wherein an etching resist pattern is formed by a screen printing and the through-holes are then filled by an appropriate means, it is impossible to form a circuit pattern with a line width of 200μ or less and moreover, there is a drawback of lacking in reliability as an etching resist because of easy occurence of shoulder defects in through holes, and the like.

In another method of using a photosensitive film, there are such problems that the film is hardly followed uneven copper metal surface on a plated board, and the products thus obtained often suffer from reliability as an etching resist, especially in the case with a photocuring type resin film, due to an uneven and undesired curing of the film with entrapped oxygen.

Furthermore, since a light exposure of the photosensitive resin composition is necessarily carried out though a base film, the minimum line width is only limitted to the order of 150μ.

There is an additional problem of a higher cost because of the necessity of using a base film and a protective film, as well as a photosensitive resin composition.

In the production of a printing plate and a printed circuit board, there have been well known the method wherein a photocuring type (the so-called negative working) photosensitive resin layer is applied on a copper metal on a base plate, the resin layer is exposed through a negative mask of image to an actinic radiation, thereby effecting curing of the resin at an exposed area, the remaining uncured resin is then removed by a solvent (this is called as a development step), and the product is subjected to an etching step and then to the final step of removing an exposed and cured resin as desired, or the method wherein a photolysis type (the so-called positive working) photosensitive resin layer is applied on a copper metal on a base plate, the resin layer is exposed through a positive mask of image to an actinic radiation, thereby effecting a photodegradation of the exposed resin, the exposed resin is dissolved with a solvent, and the product is subjected to an etching step and then to the final step of removing an unexposed resin.

However, in the former, there is a problem of inferior resolving power due to undesired light reflection occurring at the exposure step or the like, and in the latter, a problem of relatively poor adhesion of the photosensitive resin to the base plate.

As to the adhesion of the photosensitive resin layer to the base plate, there are two points to be carefully examined. That is, one is the adhesive power of the resin material itself, and the other is the uneven surface of the copper metal of the base plate.

It is quite difficult to apply a photosensitive resin layer onto said uneven surface intimately bonded thereto. The inventors have now found that said adhesion can be fairly improved by the adoption of an electrodeposition technique with an aqueous solution of a salt form of such resin.

Since a number of positive working resin compositions have been known, including polyoxymethylene polymer, o-nitrocarbinol esters, o-nitrophenyl acetals, quinonediazidesulfonyl esters of novolak resins and the like, if an invention is made to introduce an acidic or a basic group in the molecule of such material so that an appropriate water-soluble salt can be made therefrom, an electrodeposition technique would be successfully used in the application of the positive type photosensitive resin compositions onto said uneven surface of the copper metal on the base plate. The inventors have indeed obtained good results with said method, but have also found that for the production of a printed circuit board with a high density circuit pattern, the known positive working photosensitive resin materials are not of full satisfaction in having a reliable etching resist therefrom.

An object of the invention is, therefore, to find a novel positive working photosensitive resin composition which is based on a resin with good adhesive power and flexibility and which can be applied onto a copper metal by an electrodeposition means. An additional object of the invention is to provide a layer of a positive working photosensitive resinous composition deposited on a copper metal which will well stand to the attack from a developing liquid and an etching liquid, giving no peeling or cracks in the processing steps, and which will give a reliable etching resist therefrom. A further object of the invention is to provide a manufacturing method for a printed circuit board with through-holes bearing a high density circuit pattern, the method being excellent in giving a reliable etching resist and being superior to heretofore known methods in both economical and operational points of view.

SUMMARY OF THE INVENTION

The present invention is directed to a method of preparing a printed circuit board with plated-through-holes comprising a combination of steps of providing a plated board with a number of plated-through-holes, forming a positive working photoresist on said plated board, exposing said photoresist through a positive mask of circuit pattern placed on said photoresist to an actinic radiation, developing said photoresist on said plated board with an aqueous or a semiaqueous alkaline solution to dissolve the exposed resin and form an etching resist, subjecting said resist to an etching to remove copper metal under the exposed area of said plated board, and finally removing said resist still remaining on an unexposed area of said plated board, which is characterized in that the formation of said positive working photoresist is carried out by an electrodeposition means with an anionic or cationic electrodeposition bath of quinonediazide sulfonic ester bearing acrylic copolymer. The drawings depict the photosensitive materials involved in each step of the method of this invention.

DESCRIPTION OF PREFERRED EMBODIMENTS

Figure 1:
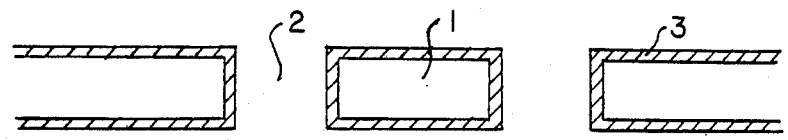
FIG. 1 shows a circuit base plate which consists of an insulating base plate 1 with through-holes 2 and a conductive coating 3.

In this specification and claims, the term "bearing" denotes both chemically bound and cold blended forms.

In the practice of the present invention, there is provided a plated board with a number of plated-through-holes. So far as the plated board is constructed in the abovementioned structure, any of the methods may be used for the preparation of said plated board. For example, such a plated board may be obtained by providing an insulating board substrate with a number of through-holes, affixing an activation material for an electroless plating use to the whole surface of said substrate including said through-holes, conducting copper electroless plating and then applying copper by an electrolytic means. Alternatively, such a plated board may be obtained by perforating a copper clad laminate at the fixed positions, affixing an activation material for an electroless plating use into said holes, and conducting a series of plating, i.e. a copper electroless plating and a copper electrolytic plating, on the whole surface including the through-holes. The positive working photoresist to be applied by the method of this invention on said copper metal on the plated board are anionic or cationic positive working, quinone diazide group bearing acrylic resin compositions which can form a continuous film on the copper metal by an electrodeposition means and can be dissolved by a developer at an exposed area of said film.

For example, such an electrodeposition bath of an anionic, positive working photosensitive resin composition may be prepared by copolymerizing an acidic group bearing $\alpha,\beta$-ethylenically unsaturated compound with a copolymerizable monomer having hydroxyl groups, adding to said hydroxyl groups of the thus obtained polymer a quinone diazide compound through an esterification reaction, neutralizing the acidic groups derived from said $\alpha,\beta$-ethylenically unsaturated compound with an alkaline substance, and dispersing the thus obtained neutralized polymer into water.

An electrodeposition bath of a cationic, positive type photosensitive resin composition may be prepared by copolymerizing monomer having at least one amino group with a hydroxy group bearing monomer, adding to a part of said hydroxyl and/or amino groups of the obtained copolymer a quinone diazide compound, through an esterification reaction, neutralizing the remaining amino groups of said copolymer with an acidic substance, and dispersing the thus obtained, neutralized polymer into water.

As the acidic group bearing $\alpha,\beta$-ethylenically unsaturated compounds to be used in the synthesis of said anionic, positive working photosensitive resin compositions, mention is made of $\alpha,\beta$-ethylenically unsaturated carboxylic acids, polymerizable organic sulfonic acids, polymerizable organic phosphoric acids and water soluble salts thereof.

Examples of $\alpha,\beta$-ethylenically unsaturated carboxylic acids are maleic acid, fumaric acid, acrylic acid, methacrylic acid and the like.

Examples of polymerizable organic sulfonic acids are 1-acryloxy-1-propane sulfonic acid, 2-acrylamide-2-methyl propane sulfonic acid, 3-methacrylamide-1-hexane sulfonic acid and the like, and examples of polymerizable organic phosphoric acids are mono (2-hydroxylethyl methacrylate) acid phosphate, acid phosphoxyethyl methacrylate, acid phosphoxy propyl methacrylate and the like.

As the water soluble salts of said acidic group bearing unsaturated compounds, mention is made of alkali metal salts, alkaline earth metal salts, amine salts and the like. Examples of hydroxyl group bearing polymerizable monomers are 2-hydroxyethyl acrylate, 2-hydroxyethyl methacrylate, $\gamma$-hydroxy styrene, and the like.

Examples of the quinone diazide compounds used in said esterification reaction are 1,2-naphthoquinone-2-diazide-5-sulfonyl chloride, 1,2-benzoquinone-2-diazide-4-sulfonyl chloride and the like.

They are, however, named only as typical examples and should not be taken in any limitative sense.

The amino group bearing polymerizable monomers to be used in the synthesis of cationic, positive working photosensitive resin compositions are dimethylaminoethyl acrylate, dimethylaminoethyl methacrylate, diethylaminoethyl acrylate, diethylaminoethyl methacrylate, diethylaminopropyl acrylamide, diethylaminopropyl methacrylamide, $\gamma$-aminostyrene, 3-(2-hydroxypropyl amino)-2-(hydroxy) propyl methacrylate, and the like. They are also merely named as typical examples of the employable materials. In the abovesaid anionic, positive working photosensitive resin composition, the ratio of acidic group bearing $\alpha,\beta$-ethylenically unsaturated compound to hydroxyl group bearing polymerizable monomer must be controlled according to the particular members selected and the molecular weight of the copolymer desired.

Said ratio is appropriately determined by taking into due consideration the water dispersibility of the resin after alkali neutralization, dissolvability at the time of development step, and resolution desired. Usually, a preferable range is from 1/99 to 80/20 in terms of molar ratio.

If the acidic group bearing component exceeds the abovesaid range, there is the case wherein resolution will get lowered since the acid molar ratio in the resin at the exposed area will undesirably come near to that of the resin in the unexposed area and for this, both exposed and unexposed resins are simultaneously dissolved at the development stage. If the acidic group bearing component is lower than the abovesaid range, there are problems of reduced water dispersibility of the resin and of diminished electrodeposition effect.

A weight average molecular weight of said copoymer may vary with the employed monomer components and the weight ratio thereof. In general, it is preferably determined in a range from 500 to 200,000, taking into account the dispersibility of the resin (after neutralization) in water, adhesive property of the electrodeposited coating, dissolvability of the resin at a development stage, resolution, and acid resistance of the resist film at an etching stage.

In the abovesaid cationic, positive working photosensitive resin composition, the ratio of amino group bearing polymerizable monomer to hydroxyl group bearing polymerizable monomer must be controlled according to the particular members selected and the molecular weight of the copolymer desired. It should also be determined by taking into due consideration acid resistance of the resist film in an etching stage of removing a conductive coating from the base plate. Usually, it is preferably determined in a range from 1/99 to 80/20 in terms of molar ratio. If the molar ratio of amino group bearing monomer exceeds the abovesaid range, there is a tendency that undesirable swelling and solution of the resist film will occur at the etching stage.

If the molar ratio of amino group bearing monomer is lower than the abovesaid range, there often occur troubles in water dispersibility of the acid neutralized resin and in an electrodeposition efficiency.

The molecular weight of said copolymer may vary with the particular monomer components selected and the weight ratio thereof. It is preferably determined in a range of 500 to 200,000, taking into account water dispersibility of the resin after neutralization, adhesive property of electrodeposited film, dissolvability of the film at a development stage, resolution, and an acid resistance of the resist film at an etching stage of removing a conductive coating from the base plate.

From the standpoints of adhesive property to a base plate, flexibility of the coating and others contributive toward the present objects, particularly preferable anionic or cationic, quinone diazide group bearing, acrylic resin compositions include the following:

Anionic resin composition:
Copolymer(A) of
(a) mono-olefinic unsaturated compound or conjugated diolefinic hydrocarbon
(b) unsaturated compound represented by the formula:

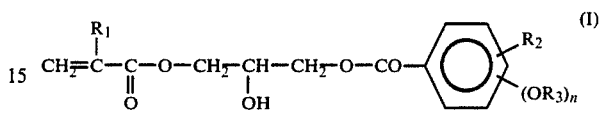

wherein
n is an integer of 1 to 3;
$R_1$ represents hydrogen atom or methyl radical;
$R_2$ is hydrogen atom, an alkyl group having 1 to 5 carbon atoms, an alkoxy group or nitro group;
$R_3$ is hydrogen atom,

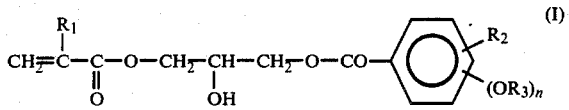

and (c) unsaturated compound having at least one acidic group selected from the group consisting of $\alpha,\beta$-ethylenically unsaturated carboxylic acids, polymerizable organic sulfonic acids, polymerizable organic phosphoric acids and salts thereof, or a mixture of copolymer (A) and other quinone diazide sulfonic ester with the content of said copolymer (A) being 5% by weight or more of said mixture.

Cationic resin composition:
Copolymer(C) of
(a) mono-olefinic unsaturated compound or conjugated diolefinic hydrocarbon
(b) unsaturated compound represented by the formula:

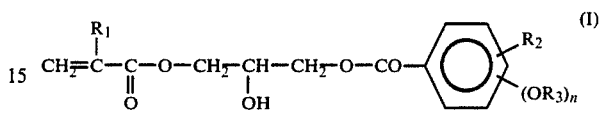

wherein n, $R_1$, $R_2$ and $R_3$ are as defined above, and
(c) unsaturated compound having amino group,
or a mixture of copolymer (C) and other quinone diazide sulfonic ester (B) with the content of said copolymer (C) being 5% by weight or more of said mixture.

Typical examples of said mono-olefinic unsaturated compounds are alkyl methacrylates such as methyl methacrylate, ethyl methacrylate, n-butyl methacrylate, sec-butyl methacrylate, t-butyl methacrylate and the like; alkyl acrylates such as methyl acrylate, isopropyl acrylate and the like; cyclic alkyl methacrylates such as cyclohexyl methacrylate, 2-methyl-cyclohexyl methacrylate and the like; cyclo alkyl acrylates such as cyclohexyl acrylate, 2-methyl-cyclohexyl acrylate and the like; aryl methacrylates such as phenyl methacrylate, benzyl methacrylate and the like; aryl acrylates such as phenyl acrylate, benzyl acrylate and the like; dicarboxylic acid diesters such as diethyl maleate, diethyl fumarate, diethyl itaconate and the like; hydroxy alkyl methacrylates such as 2-hydroxyethyl methacrylate, 2-hydroxy propyl methacrylate and the like; styrene, $\alpha$-methyl styrene, o-methyl styrene, m-methyl styrene, p-methyl styrene, vinyl toluene, p-methoxy styrene, acrylonitrile, methacrylonitrile, vinyl chloride, vinylidene chloride, acrylamide, methacrylamide, vinyl acetate and the like. Typical examples of said conjugated diolefinic hydrocarbons are 1,3-butadiene, isoprene, chloroprene, dimethyl butadiene and the like.

The unsaturated compounds represented by the formula I may be easily and advantageously prepared by reacting glycidyl acrylate or glycidyl methacrylate with a carboxylic acid of the formula:

wherein n, $R_2$ and $R_3$ are as defined above, or a combination of steps of reacting glycidyl acrylate or glycidyl methacrylate with a hydroxy carboxylic acid of the formula:

wherein n and $R_2$ are as defined above, and subsequently reacting the product with benzoquinone or naphthoquinone diazide sulfonylchloride.

As the acidic group bearing unsaturated compounds and the amino group bearing unsaturated compounds, reference should be made to the preceeding pages of this specification. The monomer weight ratio and molecular weight of the resins are also as defined previously.

The preparation of such resins may be carried out just in the same way customarily used in the preparation of an acrylic resin for coating use. Of course, the resin compositions are used, after neutralizing with alkali or acid substance, in the form of aqueous dispersions in an electrodeposition stage.

The other quinone diazide sulfonic esters used in the present invention are of the known type as described, for example, in British Patent Nos. 1,227,602, 1,329,888, 1,330,932, and U.S. Pat. No. 4,306,010.

Examples of such compounds are condensation products of naphthoquinone diazide sulfonyl chloride or benzoquinone diazide sulfonyl chloride with hydroxy group bearing lower molecular weight or higher molecular weight compounds. Typical examples of said hydroxy group bearing lower molecular weight compounds are hydroquinone, resorcin, phloroglucinol, 2,4-dihydroxy benzophenone, 2,3,4-trihydroxy benzophenone, alkyl gallate and the like. Typical examples of hydroxy group bearing higher molecular weight compounds are phenol-formaldehyde novolak resins, cresol-formaldehyde novolak resins, polyhydroxystyrenes and the like. Among them, particular preference is given to the hydroxy group bearing lower molecular weight compounds.

When $R_3$ in the generic formula (I) of the aforesaid unsaturated compound stands for hydrogen atom, the thus obtained copolymer should be used as a mixture with other quinonediazide sulfonic esters as defined above. At this time, the copolymer should preferably be 5% by weight and more of the total weight of such mixture.

The present electrodeposition baths may include other additives as coloring matter and the like customarily used in an electrodeposition bath, as desired.

In order to apply said anionic or cationic positive working photosensitive resin composition on copper metal on plated board a common electrophoresis means can be utilized in the present invention.

For example, the abovesaid plated board with through-holes is dipped in an electrodeposition bath of the anionic, positive working photosensitive resin composition, an anode is connected to the plated board and a cathode is to the metallic bath wall, direct current is flowed between the electrodes, thereby depositing the anionic, positive working photosensitive resin composition the copper metal the plated board, the thus treated board is then subjected to drying to form a continuous film of the photosensitive resin composition.

In the case of using a cationic, positive working photosensitive resin composition bath, the anode and the cathod are connected just inversely and the similar processes are carried out to obtain a continuous film of the photosensitive resin composition.

The thus obtained film is then exposed through a positive mask of circuit pattern to an actinic radiation, for example, ultra-violet rays. At this time, either in the case of anionic or cationic photosensitive layer, the quinone diazide groups of the exposed resin may be photolyticaly degradated to ketone and then to indene carboxylic acids.

Therefore, when developed with an aqueous alkaline solution, the exposed resin is dissolved and removed in the soluble salt form.

At the unexposed area, no change will occur in the case of anionic photosensitive resin, but in the case of cationic type resin, the unaffected, quinone diazide groups may undergo azo-coupling with each other in the presence of the alkaline developer, thereby resulting in a resin with far improved acid resistance and alkali resistance.

In the next place, the thus obtained board bearing an etching resist pattern is processed with an etching bath containing ferric chloride, cupric chloride or an alkali substance to remove the exposed copper metal from the board. Finally, the resin composition still remaining on the copper metal at the unexposed area is removed by the treatment with an appropriate solvent or the like.

According to the present method, it is possible to obtain a circuit board bearing a high density circuit pattern in the order of $100\mu$ line width.

This method is far superior to the heretofore proposed screen printing method and photosensitive film method in respect of simplicity of processing, reliability of product and economical point of view.

The invention shall be now more fully described in the following examples by referring to the attached drawings.

REFERENCE EXAMPLE 1

Preparation of unsaturated compound 1

Into a 1,000 ml separable flask, were placed 276 g of o-hydroxy benzoic acid, 5.4 g of N,N'-dimethylbenzylamine, 0.14 g of hydroquinone and 150 g of dioxane, and the mixture was heated under stirring to 100° C. To this, 284 g of glycidyl methacrylate were added and the combined mixture was heated under stirring and aeration at 100° C. for 6 hours. The product obtained was confirmed by IR spectrum and NMR spectrum to be 3-(o-hydroxybenzoyloxy)-2-(hydroxy) propyl methacrylate.

REFERENCE EXAMPLE 2

Preparation of unsaturated compound 2

Into a 2,000 ml separable flask, were placed 143 g of the reaction solution of unsaturated compound I, 50.5 g of triethylamine and 200 g of dioxane, and the mixture was added dropwise, under stirring and at a room temperature, with a solution of 118.2 g of 1,2-naphthoquinone-2-diazide-5-sulfonyl chloride in 800 g of dioxane. After completion of said addition, stirring was continued for additional 2 hours.

Next, the abovesaid reaction solution was dropped in 5,000 ml of water, the resulting mixture was stirred and extracted with 1,000 ml of dichloromethane. From this extract, solvent was removed off at a reduced pressure to obtain 1,2-naphthoquinone-2-diazide-5-sulfonic acid ester of 3-(o-hydroxybenzoyloxy)-2-(hydroxy) propyl methacrylate, which was identified from the IR and NMR spectrum data thereof.

REFERENCE EXAMPLE 3

Preparation of unsaturated compound 4

Into a 1,000 ml separable flask, were placed 336 g of 4-methoxy salicylic acid, 5.4 g of N,N'-dimethyl benzylof 34.2 g of butylacrylate, 39.8 g of methyl methacrylate, 73.4 g of the reaction solution of unsaturated compound 4 obtained in Reference Example 4, and 10.0 g of mono (2-hydroxy ethyl methacrylate) acid phosphate and a cataalyst solution of 2.0 g of 2,2'-azobis (4-methyoxy-2,4-dimethyl valeronitrile) in 80 g of dioxane were simultaneously dropped in over 3 hours, and thereafter the mixture was stirred for additional 2 hours to obtain a copolymer solution. The solution was then added with 16 g of triethylamine an 75.2 g of 1,2-naphthoquinone-2-diazide-5-sulfonic ester of 2,3,4-trihydroxybenzophenone and the thus obtained solution was finally added, under stirring, with 3,900 g of deionized water to obtain an electrodeposition bath liquid 6.

EXAMPLE 1

FIG. 1 shows a circuit base plate which consists of an insulating base plate 1 with through-holes 2, whose whole surface including the through-holes is covered by a conductive coating 3.

Figure 2:
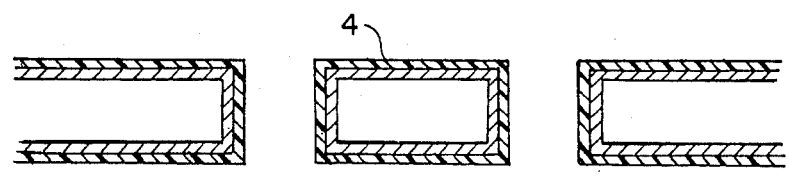
FIG. 2 shows the circuit base plate of FIG. 1 having a coating 4 of the positive type photosensitive resin composition.

The abovesaid circuit base plate was dipped into the electrodeposition bath 1 prepared by Reference Example 5. After connecting the base plate to an anode and the metallic wall of the electrodeposition bath to a cathode, 150 V direct current was impressed for 1 minute, thereby effecting the deposition of anionic, positive type photosensitive resin composition on the conductive coating 3 on the circuit base plate in about $20\mu$ thickness, and the thus obtained, electrodeposited circuit base plate was then washed with water and dried in an oven maintained at 120° C. for 5 minutes to form a coating 4 of the positive type photosensitive resin composition (see FIG. 2).

Figure 3:
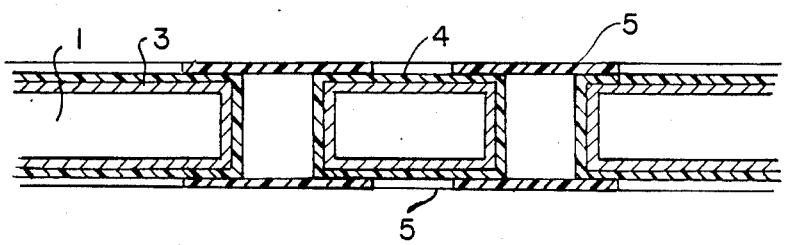
FIG. 3 shows the circuit base plate of FIG. 2 having a positive type photomask 5 with a circuit pattern.
Figure 4:
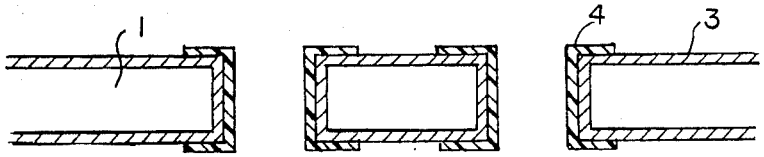
FIG. 4 shows the circuit base plate after the exposed portion of the resin coating 4 has been removed.
Figure 5:
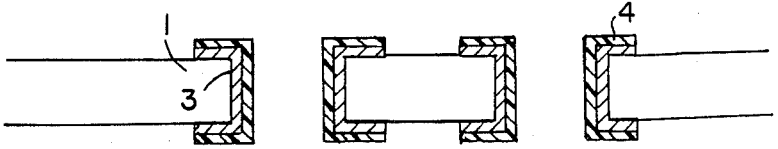
FIG. 5 shows the circuit base plate after the exposed portion of the conductive coating 3 has been removed.
Figure 6:
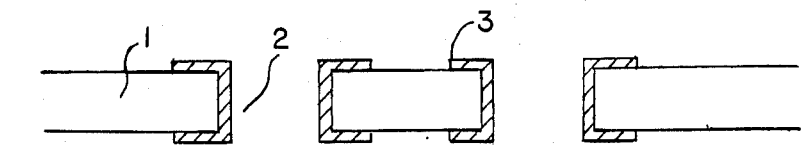
FIG. 6 shows the circuit board remaining after the positive type photosensitive resin composition coating 4 remaining in FIG. 5 has been removed.

On said positive type photosensitive resin composition coating 4, was placed a positive type photomask 5 with a circuit pattern, and the circuit base plate was illuminated from both sides thereof by a high pressure mercury lamp (see FIG. 3). Thereafter, the exposed resin composition coating was dissolved and removed in an aqueous solution of sodium carbonate adjusted to pH 9 and maintained at a temperature of less than 20° C. (FIG. 4). The exposed conductive coating 3 was then removed by subjecting to an etching operation with a ferric chloride bath (FIG. 5). Finally, the positive type photosensitive resin composition coating 4 still remaining at the portion corresponding to the circuit pattern was removed in an aqueous solution of sodium carbonate containing 20% ethylene glycol monobutyl ether, the solution being adjusted to pH 11 and maintained at 55° C., to obtain a circuit board bearing circuit pattern of line width $70\mu$ and having through-holes (see FIG. 6).

EXAMPLE 2

The same procedures as stated in Example 1 were repeated except substituting the electrodeposition bath 2 for the electrodeposition bath 1 and impressing a 50 V direct current for 1 minutes between the electrodes to deposit an anionic, positive type photosensitive resin composition on the conductive coating in about $20\mu$ thickness.

A circuit-board bearing circuit pattern of line width $80\mu$ and having through-holes was obtained.

EXAMPLE 3

The same procedures as stated in Example 1 were repeated except substituting the electrodeposition bath 3 for the electrodeposition bath 1 and impressing a 75 V direct current between the electrodes for 1 minute to deposit an anionic, positive type photosensitive resin composition in about $20\mu$ thickness on the conductive coating of the circuit base plate.

A circuit-board bearing circuit pattern of line width $80\mu$ and having through-holes was obtained.

EXAMPLE 4

The similar procedures as stated in Example 1 were repeated except substituting the electrodeposition bath 4 for the electrodeposition bath 1, reversing the connection of the base plate and metallic wall of the bath to electrodes, and impressing a 100 V direct current for 2 minutes to deposit a cationic, positive type photosensitive resin composition on a conductive coating in about $25\mu$ thickness.

A circuit board having through-holes and bearing a circuit pattern of line width $100\mu$ was obtained.

EXAMPLE 5

The same procedures as stated in Example 1 were repeated except substituting the electrodeposition bath 5 for the electrodeposition bath 1 and impressing a 50 V direct current between the electrodes for 2 minutes to deposit an anionic, positive type photosensitive resin composition on a conductive coating in about $25\mu$ thickness.

A circuit-board having through-holes and bearing a circuit pattern of line width $70\mu$ was obtained.

EXAMPLE 6

The same procedures as stated in Example 1 were repeated except substituting the electrodeposition bath 6 for the electrodeposition bath 1 and impressing a 80 V direct current between the electrodes for 1 minute to deposit an anionic, positive type photosensitive resin composition on a conductive coating in about $20\mu$ thickness.

A circuit-board having through-holes and bearing circuit pattern of line width $90\mu$ was obtained.

What is claimed is:

1. A method for preparing a printed circuit board with plated-through-holes, comprising
   providing a plated board with a number of plated-through-holes,
   forming a positive working photoresist on said plated board, exposing said photoresist through a positive mask of circuit pattern placed on said photoresist to an actinic radiation, developing said photoresist on said plated board with an aqueous or a semi-aqueous alkaline solution, thereby removing the exposed area and form an etching resist,
   subjecting said resist to an etching to remove copper metal covered with the exposed photoresist on said plated board, and finally removing said resist still remaining on the unexposed area of said plated board,
   which is characterized in that the formation of said positive working photoresist is carried out by an electrodeposition process with an anionic or cationic electrodeposition bath containing quinonediazide sulfonic ester bearing acrylic copolymer.

2. A method according to claim 1, wherein the quinonediazide sulfonic ester bearing anionic acrylic copolymer comprises a copolymer (A) of
   (a) monoolefinic unsaturated compound or conjugated diolefinic hydrocarbon, amine, 0.14 g of hydroquinone, and 150 g of dioxane, and the mixture was heated under stirring to 100° C. To this, 284 g of glycidyl methacrylate were added and the mixture was stirred under aeration at 100° C. for 6 hours. Thus obtained product was identified from IR and NMR spectrum data to be 3-(2-hydroxy-4-methoxybenzoyloxy)-2-(hydroxy) propyl methacrylate.

REFERENCE EXAMPLE 4

Preparation of unsaturated compound 4

Into a 1,000 ml separable flask, were 376 g of gallic acid, 5.4 g of N,N'-dimethylbenzylamine, 0.14 g of hydroquinone and 200 g of dioxane, and the mixture was heated under stirring to 100° C. To this, was added 284 g of glycidyl methacrylate and the mixture was further stirred under aeration at 100° C. for 6 hours. The product was confirmed by IR and NMR spectrum to be 3-(3,4,5-trihydroxybenzoyloxy)-2-(hydroxy) propyl methacrylate.

REFERENCE EXAMPLE 5

Preparation of electrodeposition bath 1

Into a 2,000 ml separable flask, was placed 100 g of ethyleneglycol monomethyl ether and it was heated to 80° C. To this, were added 43 g of methacrylic acid, 120 g of 2-hydroxyethyl methacrylate and a solution of 3 g of 2,2'-azobis (4-methoxy-2,4-dimethyl valeronitrile) in 100 g of dioxane simultaneously over 3 hours and the combined mixture was further stirred for 2 hours to obtain a copolymer solution.

Thereafter, the copolymer solution was added with 60 g of triethylamine and then dropwise with a solution of 134 g of 1,2-naphthoquinone-2-diazide-5-sulfonyl chloride in 800 g of dioxane at a room temperature and under stirring. After completion of said addition, stirring was continued for 2 hours. Next, the reaction solution was dropped in 5,000 ml of water and stirred well. The reaction product was extracted with 1,000 ml of dichloromethane and the solvent was removed at a reduced pressure to obtain 1,2-naphthoquinone-2-diazide-5-sulfonic ester. 150 g of the thus obtained ester were dissolved in 100 g of cyclohexanone and the solution was added with 12 g of monoethanolamine and then gradually with 2,700 g of deionized water under stirring to obtain an electrodeposition bath liquid 1.

REFERENCE EXAMPLE 6

Preparation of electrodeposition bath 2

Into a 500 ml separable flask, was added 60 g of ethyleneglycol monomethyl ether and the content was heated to 80° C. To this, were added 34.2 g of butyl acrylate, 39.8 g of methyl methacrylate, and 71.5 g of the reaction solution of unsaturated compound I, and the mixture was added dropwise and simultaneously with a solution of 9.6 g of 2-acrylamide-2-methyl propane sulfonic acid in a mixture of 15 g of ethyleneglycol monomethyl ether and 15 g of deionized water and a solution of 2.8 g of 2,2'-azobis (4-methoxy-2,4-dimethyl valeronitrile) in 80 g of dioxane in 3 hours. After completion of said addition, the combined mixture was stirred for additional 2 hours to obtain a copolymer solution. Next, the copolymer solution was added with 3.8 g of triethylamine and then with 75.2 g of 1,2-naphthoquinone-2-diazide-5-sulfonic ester and 4,000 g of deionized water and the mixture was stirred well to obtain an electrodeposition bath liquid 2.

REFERENCE EXAMPLE 7

Preparation of electrodeposition bath 3

Into a 500 ml separable flask, was placed 80 g of ethyleneglycol monomethyl ether and the content was heated to 80° C. To this, were added 30.8 g of butyl acrylate, 5.2 g of methyl methacrylate, 32.2 g of reaction solution of unsaturated compound I, and 15.4 g of unsaturated compound 2, and the mixture was further added simultaneously with a solution of 2-acrylamide-2-methylpropane sulfonic acid in a mixture of 15 g of ethyleneglycol monomethyl ether, 15 g of deionized water and 3.5 g of triethylamine and a solution of 2.0 g of 2,2'-azobis (4-methoxy-2,4-dimethyl valeronitrile) in 80 g of dioxane in 3 hours. After completion of said addition, the mixture was further stirred for 2 hours to obtain a copolymer solution.

The copolymer solution was then added with 1,400 g of deionized water to obtain an electrodeposition bath liquid 3.

REFERENCE EXAMPLE 8

Preparation of electrodeposition bath 4

Into a 500 ml separable flask, was placed 80 g of ethyleneglycol monomethyl ether and the content was heated to 80° C. To this, were added a monomer solution consisting of 34.2 g of butyl acrylate, 39.8 g of methyl methacrylate, 71.5 g of reaction solution of unsaturated compound I, and 12.0 g of 3-(2-hydroxypropyl amino)-2-(hydroxy) propyl methacrylate and a solution of 2.0 g of 2,2'-azobis (4-methoxy-2,4-dimethyl valeronitrile) in 80 g of dioxane in 3 hours and the combined mixture was further stirred for 2 hours to obtain a copolymer solution.

The copolymer solution was then added with 3.3 g of acetic acid and then with 50 g of 1,2-naphthoquinone-2-diazide-5-sulfonic ester of 2,4-dihydroxybenzophenone and thus obtained mixture was added under stirring with 3,500 g of deionized water to obtain an electrodeposition bath liquid 4.

REFERENCE EXAMPLE 9

Preparation of electrodeposition bath 5

Into a 500 ml separable flask, was added 60 g of ethyleneglycol monomethyl ether and the content was heated to 80° C. To this, were added dropwise and simultaneously with a monomer solution of 34.2 g of butyl acrylate, 39.8 g of methylmethacrylate, 70.0 g of reaction solution of unsaturated compound 3 and 10.0 g of mono (2-hydroxyethyl methacrylate) acid phosphate and a catalyst solution of 2.0 g of 2,2'-azobis (4-methoxy-2,4-dimethyl valeronitrile) in 80 g of dioxane in 3 hours and the combined solution was further stirred for 2 hours to obtain a copolymer solution. Next, the copolymer solution was added with 16 g of triethylamine and 75.2 g of 1,2-naphthoquinone-2-diazide-5-sulfonic ester of 2,3,4-trihydroxybenzophenone and to thus obtained solution, 4,000 g of deionized water were gradually added under stirring to obtain an electrodeposition bath liquid 5.

REFERENCE EXAMPLE 10

Preparation of electrodeposition bath 6

Into a 500 ml separable flask, was placed 60 g of ethyleneglycol monomethylether and the content was heated to 80° C. To this, a monomer solution consisting (b) unsaturated compound represented by the formula:

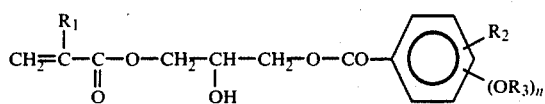

in which n is an integer of 1 to 3; $R_1$ is hydrogen atom or methyl group; $R_2$ is hydrogen atom, alkyl having 1 to 5 carbon atoms, alkoxy or nitro group; $R_3$ is hydrogen atom,

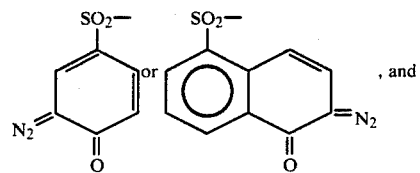 , and (c) unsaturated compound having at least one acidic group selected from the group consisting of α,β-ethylenically unsaturated carboxylic acids, polymerizable organic sulfonic acids, polymerizable organophosphoric acids, and salts thereof, or a mixture of said copolymer (A) and other quinonediazide sulfonic ester (B), the content of said copolymer (A) being 5% by weight or more of said mixture.

3. A method according to claim 1, wherein the quinonediazide sulfonic ester bearing cationic acrylic copolymer (C) of
(a) monoolefinic unsaturated compound or conjugated diolefinic hydrocarbon,
(b) unsaturated compound represented by the formula:

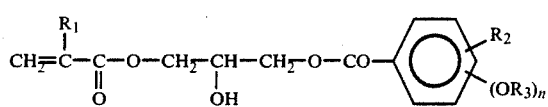

in which $R_1$, $R_2$, $R_3$ and n are as defined above, and
(c) unsaturated compound having amino group, or a mixture of said copolymer (C) and other quinonediazide sulfonic ester (B), the content of said copolymer (C) being 5% by weight or more of said mixture.

* * * * *